United States Patent
Shimada et al.

(10) Patent No.: US 7,572,758 B2
(45) Date of Patent: Aug. 11, 2009

(54) CLEANING LIQUID AND CLEANING METHOD

(75) Inventors: Kenji Shimada, Tokyo (JP); Kojiro Abe, Tokyo (JP); Masaru Ohto, Tokyo (JP); Hiroshi Matsunaga, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 527 days.

(21) Appl. No.: 11/202,145

(22) Filed: Aug. 12, 2005

(65) Prior Publication Data

US 2006/0040838 A1 Feb. 23, 2006

(30) Foreign Application Priority Data

Aug. 18, 2004 (JP) ............................. 2004-238256

(51) Int. Cl.
*H01L 21/02* (2006.01)
(52) U.S. Cl. ..................... 510/175; 252/79.4
(58) Field of Classification Search ................. 510/175; 252/79.4
See application file for complete search history.

(56) References Cited

U.S. PATENT DOCUMENTS

| | | | |
|---|---|---|---|
| 4,339,340 A | 7/1982 | Muraoka et al. | |
| 6,030,932 A | 2/2000 | Leon et al. | |
| 6,191,086 B1 | 2/2001 | Leon et al. | |
| 2002/0127357 A1 | 9/2002 | Boyd et al. | |
| 2002/0137357 A1 | 9/2002 | Chen | |
| 2003/0192859 A1 | 10/2003 | Uematsu et al. | |
| 2003/0211678 A1* | 11/2003 | Chen et al. | 438/200 |
| 2004/0099290 A1 | 5/2004 | Morinaga et al. | |
| 2004/0106531 A1 | 6/2004 | Kanno et al. | |
| 2004/0137736 A1 | 7/2004 | Daviot et al. | |
| 2004/0188285 A1* | 9/2004 | Yoshikawa | 206/278 |
| 2004/0224866 A1* | 11/2004 | Matsunaga et al. | 510/175 |
| 2005/0287480 A1* | 12/2005 | Takashima | 430/331 |

OTHER PUBLICATIONS

Search Report for Singapore Application No. 200505166-9, dated Oct. 18, 2006.
Extended European Search Report dated Aug. 18, 2008, for Application No. EP 05 10 7342.

* cited by examiner

*Primary Examiner*—Gregory E Webb
(74) *Attorney, Agent, or Firm*—Antonelli, Terry, Stout & Kraus, LLP.

(57) ABSTRACT

A cleaning liquid is provided, which comprises an aqueous solution containing nitric acid, sulfuric acid, a fluorine compound, and a basic compound. The concentration of water in the cleaning liquid is 80% by weight or more, and the pH value of the cleaning liquid is from 1 to less than 3. The cleaning liquid is effective for removing etching residues formed in a dry etching process from semiconductor devices and display devices without oxidizing and corroding their metal wirings, particularly, copper wirings and the materials of insulating films.

11 Claims, 1 Drawing Sheet

CLEANING LIQUID AND CLEANING METHOD

BACKGROUND OF THE INVENTION

1. Field of the Invention

The present invention relates to a cleaning liquid and a cleaning method for removing etching residues formed on the surfaces of semiconductor devices and display devices in the production thereof, and particularly to a cleaning liquid and a cleaning method for removing etching residues, which firmly adhere to the surfaces of semiconductor devices and display devices, without damaging the materials of semiconductor devices and display devices such as metal wirings, interlayer insulation films, etc.

2. Description of the Prior Art

At present, semiconductor devices such as highly integrated LSI are generally produced by lithographic methods. The lithographic production of semiconductor devices generally includes sequential step: a step of forming electroconductive thin films, such as metal films, which are finally made into wirings; a step of forming interlayer insulation films such as silicon oxide films for insulating electroconductive thin films and wirings on a substrate such as silicon wafer; a step of forming an overlying photosensitive layer by coating a photoresist uniformly; a step of forming a patterned resist film by a pattern exposure and subsequent development of the photosensitive layer; a step of patterning the underlying thin films by a selective etching utilizing the patterned resist film as a mask; and a step of removing the remaining patterned resist film completely.

Recently, semiconductor devices come to be integrated more highly, and the formation of a pattern of 0.18 µm or smaller is required. As the processing dimension becomes extremely finer, the dry etching has come to dominate in the selective etching process. In the dry etching process, it is known that residues derived from dry etching gas, resist, film to be etched and materials of the treating chamber of dry etching apparatus (hereinafter, the residues will be referred to as "etching residues") are formed. The etching residues remaining inside and around via holes unfavorably increase the resistance and cause electric short circuits.

As the cleaning liquid for removing etching residues formed during the formation of metal wirings, organic amine-containing stripping liquids composed of a mixture of an alkanolamine and an organic solvent have been disclosed (JP 62-49355A and JP 64-42653A). When the proposed stripping liquids are washed with water after removing etching residues and remaining resist, the amine is dissociated by the absorbed water and the stripping liquids become alkaline, to corrode metal films, etc. Therefore, an organic solvent such as an alcohol, in place of water, must be used as the rinsing liquid, to reduce the safety and increase environmental load.

As the cleaning liquid more powerful in removing etching residues and resist films than the organic amine-containing stripping liquids, fluorine-containing cleaning liquids composed of a fluorine compound, an organic solvent, a corrosion inhibitor, etc. have been disclosed (JP 7-201794A and JP 11-67632A). Under recent severe conditions of dry etching in the production of semiconductor devices, the resists are degraded significantly. The proposed organic amine-containing stripping liquids and fluorine-containing cleaning liquids are less effective for completely removing such degraded resists.

Since the organic amine-containing stripping liquids and the fluorine-containing cleaning liquids contain a large amount of organic solvents, the use thereof in the production of semiconductor devices necessitates undue precautions for safety and for reducing environmental load, such as the treatment of liquid wastes. To remove such drawbacks, acid-containing cleaning liquids such as an aqueous solution of an organic acid and an aqueous solution of nitric acid, sulfuric acid and phosphoric acid have been proposed (JP 10-72594A and JP 2000-338686A). However, the proposed acid-containing cleaning liquids are less effective for removing firmly adhered etching residues, particularly, etching residues containing silicon, silicon oxides, copper oxides, etc.

Therefore, there has been a strong demand for a cleaning liquid that removes etching residues, particularly, etching residues containing silicon, silicon oxides, copper oxides, etc. completely without damaging the wiring materials, particularly, copper and that is highly safe and environmentally friend.

SUMMARY OF THE INVENTION

The present invention is directed to provide a cleaning liquid and a cleaning method for quickly removing etching residues, particularly etching residues containing silicon, silicon oxides, copper oxides, etc. which are formed during dry etching in the wiring process in the production of semiconductor devices and display devices without oxidizing or corroding the materials of copper wirings, insulating films, etc.

Thus, the present invention provides a cleaning liquid for semiconductor devices and display devices having metal wirings, which is an aqueous solution containing nitric acid, sulfuric acid, a fluorine compound, and a basic compound, wherein a content of water is 80% by weight or more of the cleaning liquid and a pH value of the cleaning liquid is form 1 to less than 3.

The present invention further provides a cleaning method of semiconductor devices and display devices having metal wirings, which includes a step of bringing the semiconductor devices and display devices into contact with the cleaning liquid mentioned above.

DETAILED DESCRIPTION OF THE INVENTION

Figure 1:
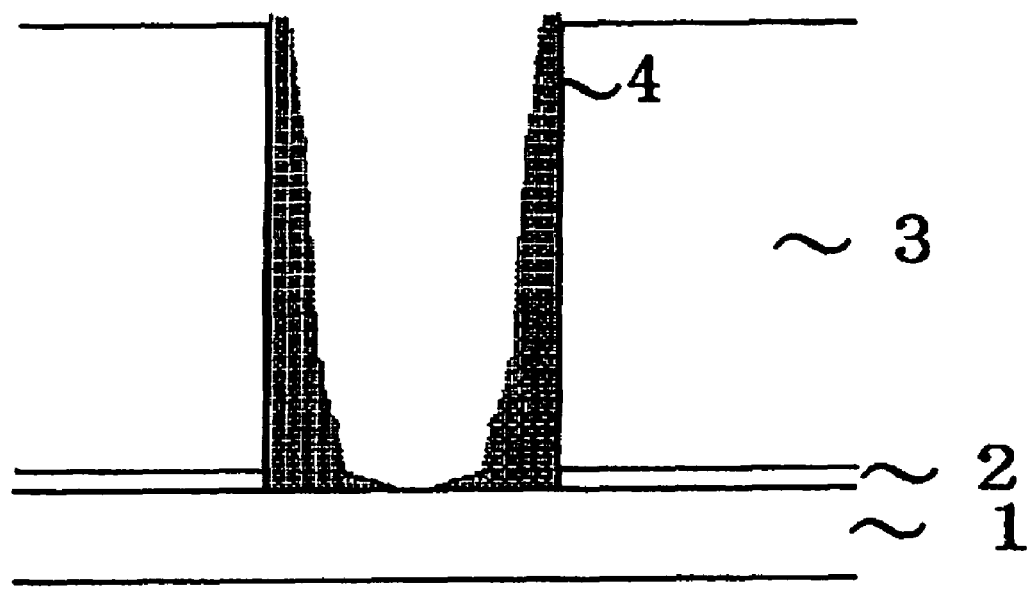
FIG. 1 is a partially cross-sectional view of a semiconductor device after subjected to etching and removal of remaining resist, showing the formation of etching residues on the sidewalls of etched portion.

The concentration of each of nitric acid and sulfuric acid in the cleaning liquid is preferably from 0.001 to 10% by weight, and more preferably from 0.005 to 8% by weight. The concentrations of nitric acid and sulfuric acid may be the same or different. Preferably, the weight ratio of sulfuric acid/nitric acid is from 0.1 to 1000, and more preferably from 1 to 100.

Examples of the fluorine compounds include hydrofluoric acid, acidic ammonium fluoride, and quaternary ammonium fluorides represented by the following formula 1:

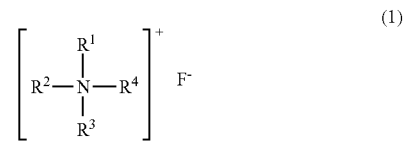

wherein each of $R^1$, $R^2$, $R^3$ and $R^4$ is independently alkyl group, aralkyl group, alkenyl group, aryl group, hydroxyalkyl group or alkoxyalkyl group. Specific examples of the quaternary ammonium fluorides of the formula 1 include tetramethylammonium fluoride, tetraethylammonium fluoride, triethylmethylammonium fluoride, trimethylhydroxyethylammonium fluoride, tetraethanolammonium fluoride, and methyltriethanolammonium fluoride, with ammonium fluoride and tetramethylammonium fluoride being preferred.

These fluorine compounds may be used alone or in combination of two or more. The content of the fluorine compound in the cleaning liquid is preferably from 0.001 to 15% by weight, and more preferably from 0.005 to 10% by weight.

Examples of the basic compounds include ammonia, primary amines, secondary amines, tertiary amines, imines, alkanolamines, heterocyclic compounds which may have $C_{1-8}$ alkyl, and quaternary ammonium hydroxides represented by the following formula 2:

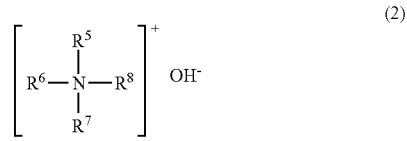

(2)

wherein each of $R^5$, $R^6$, $R^7$ and $R^8$ is independently alkyl group, aralkyl group, alkenyl group, aryl group, hydroxyalkyl group or alkoxyalkyl group.

Examples of the primary amines include ethylamine, n-propylamine, butylamine, 1-ethylbutylamine, 1,3-diaminopropane, and cyclohexylamine; examples of the secondary amines include diethylamine, di-n-propylamine, di-n-butylamine, and 4,4'-diaminodiphenylamine; examples of the tertiary amines include dimethylethylamine, diethylmethylamine, triethylamine, and tributylamine; examples of the imines include 1-propaneimine and bis(dialkylamino)imine; examples of the alkanolamines include monoethanolamine, diethanolamine, triethanolamine, diethylethanolamine, and propanolamine; examples of the heterocyclic compounds which may have $C_{1-8}$ alkyl include pyrrole, imidazole, pyrazole, pyridine, pyrrolidine, 2-pyrroline, imidazolidine, 2-pyrazoline, pyrazolidine, piperidine, piperazine, and morpholine; and examples of the quaternary ammonium hydroxides of the formula 2 include tetramethylammonium hydroxide, tetraethylammonium hydroxide, tetrabutylammonium hydroxide, trimethylhydroxyethylammonium hydroxide (choline), and tetraethanolammonium hydroxide, with tetramethylammonium hydroxide and trimethylhydroxyethylammonium hydroxide (choline) being preferred because of their strong basicity with no metal ion.

These basic compounds may be used alone or in combination of two or more. The concentration of the basic compound in the cleaning liquid is preferably selected from a range of 0.01 to 15% by weight so as to regulate the pH of the cleaning liquid within the intended range.

To enhance the wetting properties, the cleaning liquid may further contain a surfactant such as a cationic surfactant, an anionic surfactant, a nonionic surfactant and a fluorine-containing surfactant, with the anionic surfactant being preferred, and polyoxyethylene alkyl ether phosphate and polyoxyethylene alkylaryl ether phosphate, such as "Plysurf A215C" (tradename of Dai-Ichi Kogyo Seiyaku Co., Ltd.) and "Phosphanol RS-710" (tradename of Toho Chemical Industry Co., Ltd.), being more preferred. The surfactant may be used singly or in combination of two or more. The concentration of the surfactant in the cleaning liquid, if used, is preferably from 0.001 to 5% by weight, and more preferably from 0.01 to 1% by weight.

To enhance the anti-corrosion properties against copper wirings, the cleaning liquid may further contain an anti-corrosion agent such as, but not limited to, an aromatic hydroxy compound, a triazole compound, a sugar alcohol, and a chelate compound.

Examples of the aromatic hydroxy compounds include phenol, cresol, xylenol, pyrocatechol, tert-butylcatechol, resorcinol, hydroquinone, pyrogallol, 1,2,4-benzenetriol, salicyl alcohol, p-hydroxybenzyl alcohol, o-hydroxybenzyl alcohol, p-hydorxyphenethyl alcohol, p-aminophenol, m-aminophenol, diaminophenol, a minoresorcinol, p-hydroxybenzoic acid, o-hydroxybenzoic acid, 2,4-dihydroxybenzoic acid, 2,5-dihydroxybenzoic acid, 3,4-dihydroxybenzoic acid, 3,5-dihydroxybenzoic acid, and gallic acid. Examples of the sugar alcohols include sorbitol, xylitol and palatinit. Examples of the triazole compounds include benzotriaole, aminotriazole and aminotetrazole. Examples of the chelate compounds include phosphoric acid-based compounds such as 1,2-propanediaminetetramethylenephosphonic acid and hydroxyethanephosphonic acid; carboxylic acid-based compounds such as ethylenediaminetetraacetic acid, dihydroxyethylglycine, nitrilotriacetic acid, oxalic acid, citric acid, malic acid, and tartaric acid; amine compounds such as bipyridine, tetraphenylporphyrin, phenanthroline, and 2,3-pyridinediol; oxime compounds such as dimethylglyoxime and diphenylglyoxime; and acetylene compounds such as phenylacetylene and 2,5-dimethyl-3-hexyne-2,5-diol. These anti-corrosion agents may be used alone or in combination of two or more. The concentration of the anti-corrosion agent in the cleaning liquid, if used, is preferably from 0.001 to 10% by weight, and more preferably from 0.005 to 5% by weight.

Other additives used in known cleaning liquids may be also usable in the cleaning liquid of the invention, if necessary, as long as the incorporation thereof is not adversely affect the effects of the invention. Such additives may include, but not limited to, organic acids, their salts, nucleophilic amines, and their salts.

Examples of the organic acids include formic acid, acetic acid, propionic acid, oxalic acid, malonic acid, maleic acid, succinic acid, adipic acid, lactic acid, butyric acid, malic acid, pyruvic acid, citric acid, benzoic acid, 1,4-naphthoquinone-2-sulfonic acid, ascorbic acid, isoascorbic acid, salicylic acid, and aminocarboxylic acids such as ethylenediaminetetraacetic acid, hydroxyethylethylenediaminetriacetic acid, 1,3-propanediaminetetraacectic acid, diethylenetriaminepantaacetic acid, triethylenetetraminehexaacetic acid, nitrilotriacetic acid and hydroxyethyliminodiacetic acid. Examples of the nucleophilic amines include hydroxylamine, diethylhydroxylamine, hydrazine, and N,N-dimethylhydrazine. These may be used alone or in combination of two or more. The concentration of such additives in the cleaning liquid, if used, is preferably from 0.001 to 10% by weight and more preferably from 0.005 to 5% by weight.

The pH of the cleaning liquid is from 1 to less than 3, preferably from 2 to less than 3. The upper limit of each pH range is preferably 2.9. The pH is selected from the above range according to etching conditions and the kinds of materials of semiconductor device components and display device components.

The cleaning method of the invention is conducted, for example, in a manner described below. An electroconducting thin film to be made into wirings and an insulating film are successively formed on a substrate. Then, a photoresist is applied thereon. The photoresist film is patterned by exposure to a pattern of light and development. Using the patterned photoresist film as a mask, the non-protected area of the insulating film is selectively etched. Thereafter, the remaining photoresist film is removed by ashing. As shown in FIG. 1, the etching residues 4 remain on the etched surface and its vicinities even after the removal of the photoresist film. Then, the etching residue are removed by bringing the semiconductor device into contact with the cleaning liquid. The contact treatment is performed by spray, application, immersion, etc., utilizing ultrasonic wave, if needed. The contact temperature and the contact time depend on the etching conditions and the materials of semiconductor device components, and preferably from room temperature to 90° C., and more preferably from 0.5 to 30 min. After removing the etching residues, the rinsing with only water is sufficient in the method of the invention, and the use of organic solvent such as alcohol is not needed.

The cleaning liquid and cleaning method of the invention is applicable to semiconductor devices and display devices including substrate materials such as silicon, amorphous silicon, polysilicon and glass; insulating materials such as silicon oxide and silicon nitride; barrier materials such as titanium, titanium nitride, tantalum and tantalum nitride; wiring materials such as copper, tungsten, titanium-tungsten, aluminum, chromium and chromium alloys; compound semiconductors such as gallium-arsenic, gallium-phosphorus and indium-phosphorus; and oxide semiconductor such as chromium oxide. Particularly, the cleaning liquid of the invention is effective for removing the etching residues containing silicon, silicon oxides, cupper oxides, etc. from semiconductor devices and display devices having metal wirings made of only copper or laminated metal wirings of copper and a barrier material such as titanium, titanium nitride, tantalum and tantalum nitride.

The present invention will be explained in more detail by reference to the following examples which should not be construed to limit the scope of the present invention.

EXAMPLES 1-10 AND COMPARATIVE EXAMPLES 1-3

On a substrate, a copper wiring film 1 was formed, on which a silicon nitride film 2 and a silicon oxide film 3 were successively formed by CVD. A photoresist was applied onto the silicon oxide film 3, exposed to a pattern of light and developed, to form a patterned resist. Using the patterned resist as the mask, the silicon nitride film 2 and the silicon oxide film 3 were selectively etched, and then, the remaining resist was removed by ashing, to obtain a semiconductor device. A partially cross-sectional view of the semiconductor device is shown in FIG. 1 which shows that the etching residues 4 remain on the sidewalls of the etched portion.

The semiconductor device having copper wirings was cleaned with each of the cleaning liquids shown in Tables 1 and 3 under the conditions shown in Tables 2 and 4, rinsed with super pure water, and dried. The surface of the dried semiconductor device was observed under a scanning electron microscope (SEM) to evaluate the removal of etching residues and the corrosion of copper wirings according to the following ratings. The results are shown in Tables 2 and 4.

Evaluation Ratings
    Removal of etching residues
        A: Completely removed.
        B: Nearly completely removed.
        C: Partly remained.
        D: Substantial part remained.
    Corrosion of cooper wirings
        A: No corrosion.
        B: Substantially no corrosion.
        C: Apparent crater or pit corrosion.
        D: Copper film was roughened over its entire surface and recessed.

As seen from Table 2, in Examples 1 to 10 where the cleaning liquids of the invention were used, the etching residues were completely removed without corroding copper.

TABLE 1

| | Concentrations (% by weight) | | | | | |
|---|---|---|---|---|---|---|
| Examples | Nitric Acid | Sulfuric Acid | Fluorine Compound | | Basic Compound | |
| 1 | 0.1 | 4 | AF | 0.06 | TAH | 8.8 |
| 2 | 0.1 | 4 | TAF | 0.10 | TAH | 6.5 |
| 3 | 0.1 | 4 | AF | 0.15 | TAH | 7.2 |
| 4 | 1.0 | 4 | TAF | 0.10 | TAH | 8.0 |
| 5 | 0.1 | 8 | TAF | 0.10 | TAH | 10.9 |
| 6 | 0.1 | 4 | AF | 0.05 | choline | 6.5 |
| 7 | 0.1 | 4 | TAF | 0.30 | TAH | 6.4 |
| 8 | 0.1 | 4 | AF | 0.05 | TAH | 6.7 |
| 9 | 0.1 | 4 | TAF | 0.10 | TAH | 2.5 |
| 10 | 0.1 | 4 | AF | 0.05 | TAH | 6.7 |

| | Concentrations (% by weight) | | | |
|---|---|---|---|---|
| Examples | Anti-corrosion agent/Additive | | Water | pH |
| 1 | L-ascorbic acid | 1.0 | 86.04 | 2.0 |
| 2 | — | — | 89.30 | 2.0 |
| 3 | — | — | 88.55 | 2.9 |
| 4 | EDTA | 0.01 | 86.89 | 2.9 |
| 5 | hydroxylamine | 0.5 | 80.40 | 2.9 |
| 6 | Phosphanol RS-710 | 0.1 | 89.25 | 2.0 |
| 7 | Phosphanol RS-710<br>formic acid | 0.1<br>0.1 | 89.00 | 2.9 |
| 8 | EDTA<br>hydroxylamine | 0.01<br>0.5 | 88.64 | 2.0 |
| 9 | Phosphanol RS-710<br>hydrazine | 0.1<br>0.5 | 92.70 | 2.0 |
| 10 | EDTA<br>formic acid | 0.01<br>0.1 | 89.04 | 2.0 |

AF: ammonium fluoride
TAF: tetramethylammonium fluoride
TAH: tetramethylammonium hydroxide
Phosphanol RS-710: tradename of Toho Chemical Industry Co., Ltd.
EDTA: ethylenediaminetetraacetic acid

TABLE 2

| | Cleaning Conditions | | Cleaning Results | |
|---|---|---|---|---|
| Examples | Temperature (° C.) | Time (min) | Removal of etching residues | Corrosion of copper |
| 1 | 30 | 2 | A | A |
| 2 | 30 | 2 | A | A |
| 3 | 30 | 2 | A | A |
| 4 | 50 | 1 | A | A |
| 5 | 30 | 2 | A | A |
| 6 | 30 | 2 | A | A |
| 7 | 30 | 2 | A | A |
| 8 | 30 | 2 | A | A |
| 9 | 30 | 2 | A | A |
| 10 | 30 | 2 | A | A |

TABLE 3

| Comparative Examples | Concentrations (% by weight) | | | | | | | pH |
|---|---|---|---|---|---|---|---|---|
| | Nitric Acid | Sulfuric Acid | Fluorine Compound | | Basic Compound | | Water | |
| 1 | — | 4 | AF | 0.05 | TAH | 7.0 | 88.95 | 2.9 |
| 2 | 0.1 | — | TAF | 0.1 | — | — | 99.80 | 2.9 |
| 3 | 0.1 | 4 | — | — | TAH | 7.4 | 88.59 | 2.9 |

AF: ammonium fluoride
TAF: tetramethylammonium fluoride
TAH: tetramethylammonium hydroxide

TABLE 4

| Comparative Examples | Cleaning Conditions | | Cleaning Results | |
|---|---|---|---|---|
| | Temperature (° C.) | Time (min) | Removal of etching residues | Corrosion of copper |
| 1 | 30 | 5 | C | A |
| 2 | 30 | 5 | C | A |
| 3 | 30 | 5 | D | A |

The cleaning liquid of the invention is safe and environmentally friend. Using the cleaning liquid, the etching residues on semiconductor devices and display devices are easily removed within a short period of time. Since the wiring materials are not corroded, the use of the cleaning liquid enables the production of high precision and high quality circuit wirings. In addition, the rinse after treating with the cleaning liquid is effected by using only water without needing an organic solvent such as alcohol.

What is claimed is:

1. A cleaning liquid for semiconductor devices and display devices having metal wirings, which is an aqueous solution containing nitric acid, sulfuric acid, a fluorine compound, and a basic compound, wherein a content of water is 80% by weight or more of the cleaning liquid and a pH value of the cleaning liquid is from 1 to less than 3, wherein a weight ratio of sulfuric acid/nitric acid is from 0.1 to 1000, wherein the fluorine compound is ammonium fluoride or tetramethylammonium fluoride, and wherein a content of the fluorine compound is from 0.001 to 15% by weight of the cleaning liquid.

2. The cleaning liquid according to claim 1, wherein the basic compound is a strong base containing no metal ion.

3. The cleaning liquid according to claim 1, wherein the basic compound is tetramethylammonium hydroxide or trimethylhydroxyethylammonium hydroxide.

4. The cleaning liquid according to claim 1, further comprising a surfactant and/or an anti-corrosion agent.

5. The cleaning liquid according to claim 4, wherein the surfactant is an anionic surfactant.

6. The cleaning liquid according to claim 4, wherein the surfactant is polyoxyethylene alkyl ether phosphate or polyoxyethylene alkylaryl ether phosphate.

7. The cleaning liquid according to claim 1, wherein the metal wirings are made of only copper or the metal wirings have laminated structure of copper and a barrier material.

8. A method of cleaning semiconductor devices or display devices having metal wirings, which comprises a step of bringing the semiconductor devices or display devices into contact with the cleaning liquid as defined in claim 1.

9. The cleaning liquid according to claim 1, wherein the weight ratio of the sulfuric acid/nitric acid is from 1 to 100.

10. The cleaning liquid according to claim 1, wherein a concentration of the basic compound is within a range of 0.01 to 15% by weight.

11. The cleaning liquid according to claim 1, wherein said pH is from 1 to 2.9.

* * * * *

UNITED STATES PATENT AND TRADEMARK OFFICE
CERTIFICATE OF CORRECTION

PATENT NO. : 7,572,758 B2  Page 1 of 1
APPLICATION NO. : 11/202145
DATED : August 11, 2009
INVENTOR(S) : Shimada et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 891 days.

Signed and Sealed this

Seventh Day of September, 2010

David J. Kappos
*Director of the United States Patent and Trademark Office*